(12) United States Patent
Miyata et al.

(10) Patent No.: US 10,276,405 B2
(45) Date of Patent: Apr. 30, 2019

(54) PLASMA PROCESSING APPARATUS

(71) Applicant: TOKYO ELECTRON LIMITED, Tokyo (JP)

(72) Inventors: Akinori Miyata, Miyagi (JP); Shigeru Senzaki, Miyagi (JP); Hirofumi Haga, Miyagi (JP); Nobutaka Nakao, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 397 days.

(21) Appl. No.: 14/964,668

(22) Filed: Dec. 10, 2015

(65) Prior Publication Data

US 2016/0172217 A1    Jun. 16, 2016

(30) Foreign Application Priority Data

Dec. 16, 2014  (JP) .................................. 2014-254376

(51) Int. Cl.
*H01L 21/67* (2006.01)
*H01J 37/32* (2006.01)

(52) U.S. Cl.
CPC .. *H01L 21/67017* (2013.01); *H01J 37/32449* (2013.01); *H01J 37/32834* (2013.01); *H01L 21/6719* (2013.01)

(58) Field of Classification Search
CPC ............ H01L 21/67017; H01L 21/6719; H01J 37/32449; H01J 37/32834
USPC ..................... 118/715; 156/345.33
See application file for complete search history.

(56) References Cited

U.S. PATENT DOCUMENTS

| | | | | |
|---|---|---|---|---|
| 5,605,637 A | * | 2/1997 | Shan ................. | H01J 37/32477 118/723 E |
| 5,891,350 A | * | 4/1999 | Shan ................. | H01J 37/32477 118/723 E |
| 5,900,103 A | * | 5/1999 | Tomoyasu .......... | C23C 16/4405 118/723 E |
| 5,919,332 A | * | 7/1999 | Koshiishi ............ | C23C 16/5096 118/723 E |

(Continued)

FOREIGN PATENT DOCUMENTS

| | | |
|---|---|---|
| JP | 2006-270017 A | 10/2006 |
| JP | 2007-258471 A | 10/2007 |
| JP | 2008-135739 A | 6/2008 |

*Primary Examiner* — Rudy Zervigon
(74) *Attorney, Agent, or Firm* — Rothwell, Figg, Ernst & Manbeck, P.C.

(57) ABSTRACT

A plasma processing apparatus includes: a processing container; a processing gas supply unit; a mounting table configured to mount a to-be-processed substrate thereon; an upper electrode provided above the mounting table; a plasma generation unit configured to supply a high frequency power to generate plasma of the processing gas; an exhaust flow path formed by a side wall of the processing container and a side surface of the mounting table; a conductive rectification plate configured to adjust a flow of the processing gas discharged to outside of the processing container; a conductor arranged in the exhaust flow path at a position higher than the rectification plate and lower than the to-be-processed substrate to face at least a part of the upper electrode. A distance of the conductor in the height direction in relation to the to-be-processed surface of the substrate is set to be within a predetermined range.

3 Claims, 7 Drawing Sheets

(56) References Cited

U.S. PATENT DOCUMENTS

| | | | | |
|---|---|---|---|---|
| 6,261,408 B1* | 7/2001 | Schneider | C23C 16/4412 | 118/715 |
| 6,264,788 B1* | 7/2001 | Tomoyasu | C23C 16/4405 | 118/500 |
| 6,273,022 B1* | 8/2001 | Pu | H01J 37/321 | 118/723 I |
| 6,426,477 B1* | 7/2002 | Koshimizu | H01J 37/32082 | 219/121.41 |
| 6,531,069 B1* | 3/2003 | Srivastava | H01J 37/3244 | 118/723 R |
| 6,568,346 B2* | 5/2003 | Pu | H01J 37/321 | 118/723 AN |
| 6,733,620 B1* | 5/2004 | Sugiyama | H01J 37/32633 | 118/715 |
| 6,963,043 B2* | 11/2005 | Fink | H01J 37/32642 | 118/723 R |
| 7,109,660 B2* | 9/2006 | Ishihara | H01J 37/32633 | 315/111.11 |
| 7,416,677 B2* | 8/2008 | Takahashi | H01J 37/32844 | 156/345.47 |
| 7,740,737 B2* | 6/2010 | Koshiishi | H01J 37/32082 | 156/345.44 |
| 7,951,262 B2* | 5/2011 | Koshiishi | H01J 37/32082 | 156/345.44 |
| 7,988,816 B2* | 8/2011 | Koshiishi | H01J 37/32018 | 118/723 E |
| 8,075,728 B2* | 12/2011 | Balakrishna | H01J 37/32449 | 118/715 |
| 8,128,831 B2* | 3/2012 | Sato | H01L 21/0273 | 216/41 |
| 8,137,471 B2* | 3/2012 | Koshiishi | H01J 37/32082 | 118/715 |
| 8,152,925 B2* | 4/2012 | Iizuka | H01J 37/3244 | 118/715 |
| 8,597,462 B2* | 12/2013 | Brown | H01J 37/32495 | 118/715 |
| 8,603,293 B2* | 12/2013 | Koshiishi | H01J 37/32018 | 118/723 E |
| 8,747,610 B2* | 6/2014 | Chen | H01J 37/32504 | 156/345.3 |
| 8,771,417 B2* | 7/2014 | Yoon | H01J 37/32357 | 118/715 |
| 8,790,489 B2* | 7/2014 | Honda | H01J 37/18 | 118/715 |
| 8,858,754 B2* | 10/2014 | Horiguchi | H01J 37/3244 | 118/723 E |
| 9,269,564 B2* | 2/2016 | Han | H01L 21/02104 | |
| 9,490,105 B2* | 11/2016 | Koshiishi | H01J 37/32018 | |
| 9,779,918 B2* | 10/2017 | Lee | H01J 37/32834 | |
| 2002/0038791 A1* | 4/2002 | Okumura | C23C 16/4412 | 216/71 |
| 2002/0108933 A1* | 8/2002 | Hoffman | H01J 37/32082 | 219/121.43 |
| 2003/0094135 A1* | 5/2003 | Komiya | C23C 16/4412 | 118/715 |
| 2003/0136766 A1* | 7/2003 | Hoffman | H01J 37/32082 | 219/121.43 |
| 2004/0040664 A1* | 3/2004 | Yang | H01J 37/321 | 156/345.51 |
| 2004/0129218 A1* | 7/2004 | Takahashi | H01J 37/32834 | 118/715 |
| 2004/0149699 A1* | 8/2004 | Hofman | H01J 37/32082 | 219/121.43 |
| 2004/0261712 A1* | 12/2004 | Hayashi | H01J 37/3244 | 118/723 E |
| 2005/0103275 A1* | 5/2005 | Sasaki | H01J 37/32642 | 118/728 |
| 2005/0103440 A1* | 5/2005 | Sato | H01J 37/32623 | 156/345.29 |
| 2005/0167052 A1* | 8/2005 | Ishihara | H01J 37/32633 | 156/345.47 |
| 2005/0178748 A1* | 8/2005 | Buchberger, Jr. | H01J 37/32082 | 219/121.48 |
| 2005/0224179 A1* | 10/2005 | Moon | H01J 37/32834 | 156/345.29 |
| 2006/0037701 A1* | 2/2006 | Koshiishi | H01J 37/32082 | 156/345.44 |
| 2006/0037702 A1* | 2/2006 | Hayashi | H01J 37/32449 | 156/345.46 |
| 2006/0066247 A1* | 3/2006 | Koshiishi | H01J 37/32018 | 315/111.21 |
| 2007/0266945 A1* | 11/2007 | Shuto | C23C 16/4585 | 118/723 E |
| 2008/0035605 A1* | 2/2008 | Takahashi | H01J 37/32844 | 216/58 |
| 2008/0110860 A1* | 5/2008 | Miller | H01J 37/32623 | 216/71 |
| 2009/0028761 A1* | 1/2009 | Devine | H01L 21/67069 | 422/186.04 |
| 2009/0218043 A1* | 9/2009 | Balakrishna | H01J 37/3244 | 156/345.33 |
| 2010/0006543 A1* | 1/2010 | Sawada | H01J 37/32091 | 216/67 |
| 2010/0175622 A1* | 7/2010 | Yoon | H01J 37/321 | 118/723 R |
| 2010/0196625 A1* | 8/2010 | Yoon | H01J 37/32357 | 427/569 |
| 2010/0206231 A1* | 8/2010 | Yoon | H01J 37/32357 | 118/723 I |
| 2011/0290419 A1* | 12/2011 | Horiguchi | H01J 37/3244 | 156/345.29 |
| 2012/0000886 A1* | 1/2012 | Honda | H01J 37/18 | 216/24 |
| 2012/0037596 A1* | 2/2012 | Eto | H01J 37/3244 | 216/67 |
| 2012/0180883 A1* | 7/2012 | Odagiri | H01L 21/67017 | 137/561 R |
| 2013/0081761 A1* | 4/2013 | Sawada | H01J 37/32422 | 156/345.3 |
| 2013/0284288 A1* | 10/2013 | Kim | F16K 15/00 | 137/526 |
| 2015/0114930 A1* | 4/2015 | Nonaka | H01J 37/32477 | 216/67 |
| 2015/0129129 A1* | 5/2015 | Shimizu | H01J 37/32651 | 156/345.3 |
| 2015/0187545 A1* | 7/2015 | Lee | H01J 37/32834 | 216/67 |
| 2016/0172217 A1* | 6/2016 | Miyata | H01J 37/32449 | 156/345.29 |
| 2016/0260582 A1* | 9/2016 | Hosaka | H01J 37/32091 | |
| 2016/0307741 A1* | 10/2016 | Aoki | H01J 37/32091 | |
| 2017/0025256 A1* | 1/2017 | Sasaki | H01J 37/32633 | |
| 2017/0092513 A1* | 3/2017 | Hosaka | H01J 37/32449 | |
| 2017/0213707 A1* | 7/2017 | Matsuura | H01J 37/32009 | |

* cited by examiner

FIG.6

PLASMA PROCESSING APPARATUS

CROSS-REFERENCE TO RELATED APPLICATIONS

This application is based on and claims priority from Japanese Patent Application No. 2014-254376, filed on Dec. 16, 2014, with the Japan Patent Office, the disclosure of which are incorporated herein in its entirety by reference.

TECHNICAL FIELD

Various aspects and exemplary embodiments disclosed herein relate to a plasma processing apparatus.

BACKGROUND

In a semiconductor manufacturing process, a plasma processing apparatus that executes a plasma processing for the purpose of, for example, deposition of a thin film or etching has been widely used. As the plasma processing apparatus, a plasma chemical vapor deposition (CVD) apparatus that performs a deposition processing of a thin film or a plasma etching apparatus that performs an etching processing may be exemplified.

The plasma processing apparatus includes a processing container configured to define a plasma processing space, a mounting table configured to mount a to-be-processed substrate thereon within the processing container, an upper electrode provided above the mounting table, and a gas supply system configured to introduce a processing gas required for a plasma reaction into the processing container. In addition, in order to turn the processing gas within the processing chamber into plasma, the plasma processing apparatus includes, for example, a plasma generation mechanism configured to supply electronic energy such as for example, microwaves or RF waves. In addition, in the plasma processing apparatus, an exhaust flow path for exhausting the processing gas to the outside of the processing container is formed by the side wall of the processing container and the side surface of the mounting table. In the exhaust flow path, a baffle plate is provided to adjust the flow of the processing gas. The baffle plate functions to rectify the gas within the processing container so as to cause the gas to be uniformly exhausted. In addition, the baffle plate usually has conductivity.

However, in the plasma processing apparatus, it has been known that electrons in the generated plasma are drawn to the conductive baffle plate and produce a reaction product on the surface of the baffle plate. Thus, a conductor is provided in the exhaust flow path in order to block the electrons. For example, there is a prior art in which a ground electrode made of a conductor is arranged in the exhaust flow path at a position that is higher than the baffle plate and lower than a to-be-processed substrate mounted on the mounting table so as to cause the electrons in the plasma to escape to the ground electrode. See, for example, Japanese Patent Laid-Open No. 2007-258471.

SUMMARY

A plasma processing apparatus according to the present disclosure includes: a processing container; a gas supply unit configured to supply a processing gas into the processing container; a mounting table provided within the processing container, and configured to mount a to-be-processed substrate thereon; an upper electrode provided at an upper side of the mounting table; a plasma generation unit configured to supply a high frequency power to at least one of the upper electrode and the mounting table to generate plasma of the processing gas within the processing container; an exhaust flow path formed by a side wall of the processing container and a side surface of the mounting table; a conductive rectification plate provided in the exhaust flow path, and configured to adjust a flow of the processing gas that is discharged to outside of the processing container by the exhaust flow path; a conductor arranged in the exhaust flow path at a position higher than the rectification plate and lower than the to-be-processed substrate mounted on the mounting table to face at least a part of the upper electrode. A distance of the conductor in a height direction in relation to a to-be-processed surface of the to-be-processed substrate is set to be within a predetermined range.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the prior art described above, an electrode facing the upper electrode does not exist in the exhaust flow path. Therefore, the generated plasma is concentrated to the central portion of the to-be-processed substrate mounted on the mounting table so that the etching rate in the central portion of the substrate is high and the etching rate in the peripheral portion is lowered. As a result, there is a problem in that the uniformity of the etching rate of the to-be-processed substrate is deteriorated.

In one exemplary embodiment, a plasma processing apparatus disclosed herein includes: a processing container; a gas supply unit configured to supply a processing gas into the processing container; a mounting table provided within the processing container, and configured to mount a to-be-processed substrate thereon; an upper electrode provided at an upper side of the mounting table; a plasma generation unit configured to supply a high frequency power to at least one of the upper electrode and the mounting table to generate plasma of the processing gas within the processing container; an exhaust flow path formed by a side wall of the processing container and a side surface of the mounting table; a conductive rectification plate provided in the exhaust flow path, and configured to adjust a flow of the processing gas that is discharged to outside of the processing container by the exhaust flow path; a conductor arranged in the exhaust flow path at a position higher than the rectification plate and lower than the to-be-processed substrate mounted on the mounting table to face at least a part of the upper electrode. A distance of the conductor in a height direction in relation to a to-be-processed surface of the to-be-processed substrate is set to be within a predetermined range.

In addition, in one exemplary embodiment of the plasma processing apparatus disclosed herein, the conductor is provided in the exhaust flow path on at least one of the side wall side of the processing container and the side surface side of the mounting table.

According to various aspects and exemplary embodiments of the present disclosure, a plasma processing apparatus is realized which is capable of improving in-plane uniformity of etching of a to-be-processed substrate.

Hereinafter, various exemplary embodiments will be described in detail with reference to the accompanying drawings. The same or corresponding parts in each of the drawings will be denoted by the same reference numerals.

[Overall Configuration of Plasma Processing Apparatus]

Figure 1:
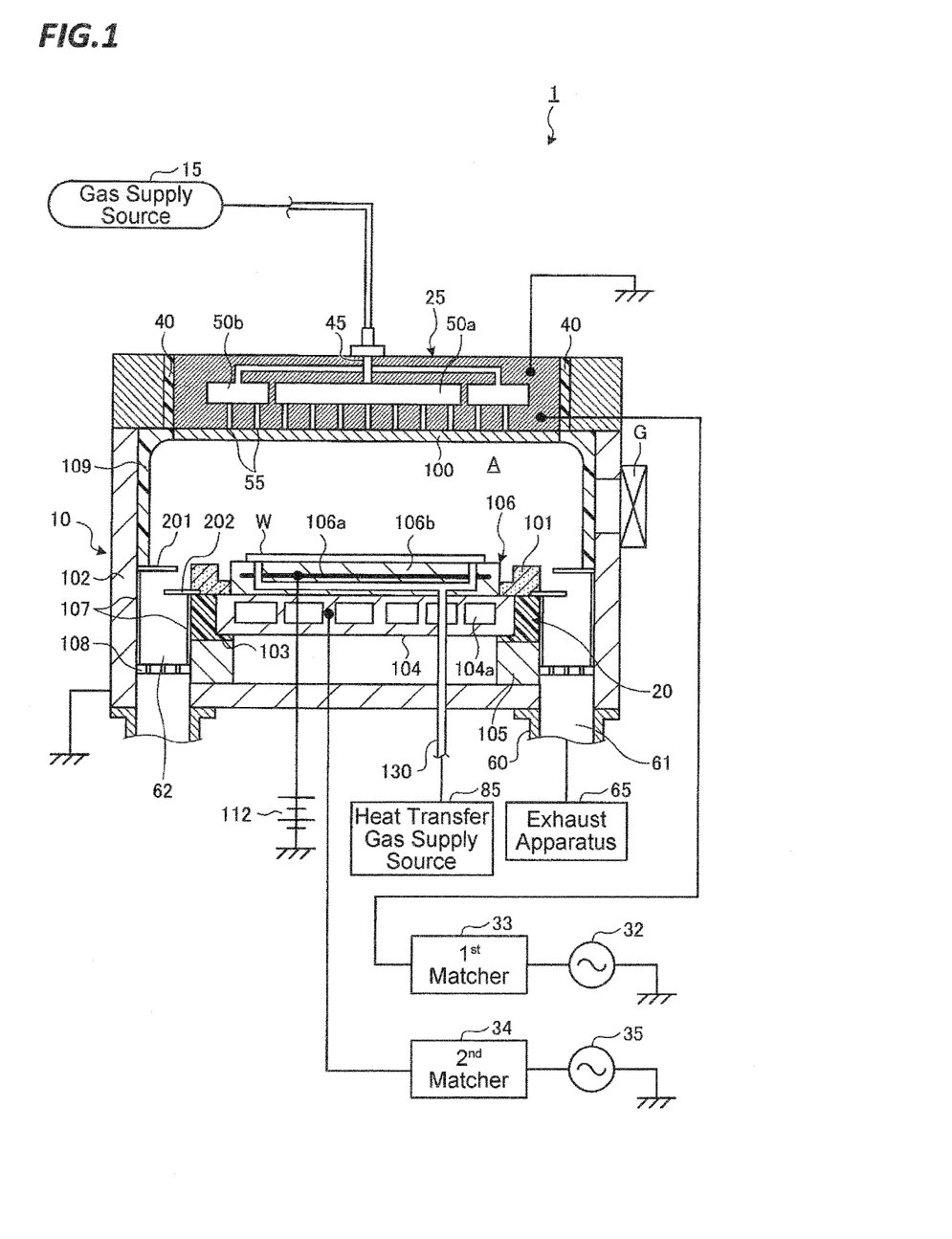
FIG. 1 is a vertical cross-sectional view illustrating a plasma processing apparatus according to an exemplary embodiment.

First, an overall configuration of a plasma processing apparatus 1 according to an exemplary embodiment will be described with reference to FIG. 1. FIG. 1 is a vertical cross-sectional view illustrating a plasma processing apparatus according to an exemplary embodiment. In the present exemplary embodiment, by way of an example, a parallel flat plate type plasma processing apparatus 1 will be described in which a lower electrode (mounting table 20) and an upper electrode 25 (shower head) are arranged to face each other within the processing container 10, and a gas is supplied to the inside of the processing container 10 from the upper electrode 25.

As illustrated in FIG. 1, the plasma processing apparatus 1 includes, for example, a processing container 10 that is formed of a conductive material such as, for example, aluminum having a surface subjected to an alumite treatment (anodizing treatment), and a gas supply source 15 configured to supply a gas into the processing container 10. The processing container 10 is grounded. The processing container 10 defines a plasma processing space A therein. In the inner wall of the processing container 10, a portion facing the plasma processing space A is covered with a volatile material 109 such as, for example, silicon or quartz. The processing container 10 is an example of the processing container. The gas supply source 15 supplies a specific gas in each plasma processing step such as, for example, etching or cleaning. The gas supply source 15 is an example of the gas supply unit.

The processing container 10 is electrically grounded, and includes a mounting table 20 therein so as to mount a wafer W thereon. The wafer W is an example of the to-be-processed substrate, and is applicable to, for example, a flat panel substrate. The mounting table 20 functions as a lower electrode. In the ceiling portion, an upper electrode 25 is provided to face the mounting table 20.

On the top surface of the mounting table 20, an electrostatic chuck 106 is provided to electrostatically attract the wafer W. The electrostatic chuck 106 is formed in a structure in which a chuck electrode 106a is sandwiched between insulation members 106b. A direct current (DC) voltage source 112 is connected to the chuck electrode 106a, and when a DC voltage is applied to the chuck electrode 106a from the DC voltage source 112, the wafer W is attracted to the electrostatic chuck 106 by a Coulomb force. On the peripheral edge of the electrostatic chuck 106, a focus ring 101 formed of, for example, silicon, is disposed in order to enhance the in-plane uniformity of etching.

The mounting table 20 is supported by an electrode (lower electrode) 104 of a conductor such as, for example, aluminum. Within the lower electrode 104, a coolant flow path 104a is formed. In the coolant flow path 104a, for example, cooling water is circulated as a proper coolant so as to cool the wafer W.

A heat transfer gas supply source 85 causes a heat transfer gas such as, for example, helium gas (He) or argon gas (Ar), to pass through a gas supply line 130 so as to supply the heat transfer gas to the space between the electrostatic chuck 106 and the wafer W. With this configuration, the electrostatic chuck 106 is subjected to a temperature control by the cooling water circulated in the coolant flow path 104a, and the heat transfer gas supplied to the rear surface of the wafer W.

The mounting table 20 is supported on the support member 105 via a holding member 103. The support member 105 is formed of an insulating material, and places the lower electrode 104 in a floating state by insulating it from the processing container 10.

A first high frequency power supply 32 is electrically connected to the upper electrode 25 via a first matcher 33. A second high frequency power supply 35 is electrically connected to the lower electrode 104 via a second matcher 34. The first high frequency power supply 32 supplies a first high frequency power of for example, 60 MHz to the upper electrode 25. The second high frequency power supply 35 supplies a second high frequency power of, for example, 13.56 MHz to the lower electrode 104. The high frequency power connection type may a lower two-frequency type or any other type, besides the upper and lower two-frequency type.

The first and second matchers 33, 34 are intended to match a load impedance to internal (or output) impedances of the first and second high frequency power supplies 32, 35, respectively, and function to make the internal impedances of the first and second high frequency power supplies 32, 35 apparently coincide with the load impedance when plasma is generated within the processing container 10.

The first and second high frequency power supplies 32, 35 are examples of the power supplies that apply the energy of electromagnetic waves to the processing container 10. As another example of the power supply that applies the energy of electromagnetic waves to the processing container 10, microwave plasma and inductively coupled plasma (ICP) may be exemplified.

The upper electrode 25 is attached to the ceiling portion of the processing container 10 via a shield ring 40 that covers the periphery of the upper electrode 25. The upper electrode 25 is electrically grounded. A portion of the upper electrode 25 that faces the plasma processing space A is covered with a volatile material 100 such as, for example, silicon or quartz.

The upper electrode 25 includes a gas inlet 45 formed therein so as to introduce the gas from the gas supply source 15. In addition, the upper electrode 25 is provided with a center side diffusion chamber 50a and an edge side diffusion chamber 50b therein. The center side diffusion chamber 50a and the edge side diffusion chamber 50b are branched from the gas inlet 45 and diffuse the gas.

A plurality of gas supply holes 55 are formed in the upper electrode 25 to supply the gas from the diffusion chambers 50a, 50b to the inside of the processing container 10. Each gas supply hole 55 is arranged to supply the gas to the space between the wafer W mounted on the lower electrode and the upper electrode 25.

The gas from the gas supply source 15 is supplied to the diffusion chambers 50a, 50b through the gas inlet 45, diffused in the diffusion chambers 50a, 50b to be distributed to respective gas supply holes 55, and then introduced into the processing container 10 toward the lower electrode from the gas supply holes 55. With this configuration, the upper electrode 25 also functions as a gas shower head that supplies a gas.

An annular exhaust flow path 62 is formed between the side wall 102 of the processing container 10 and the side surface of the mounting table 20. The inner peripheral surface of the exhaust flow path 62 is covered with a sprayed coating 107 that contains yttrium oxide. The exhaust flow path 62 is provided with a rectification plate (baffle plate) 108. The rectification plate (baffle plate) 108 adjusts the flow of the processing gas discharged to the outside of the processing container 10 by the exhaust flow path 62. The rectification plate (baffle plate) 108 is formed of a conductive material such as, for example, a metal. An exhaust pipe 60 that forms an exhaust port 61 is provided in the bottom portion of the exhaust flow path 62. An exhaust apparatus 65 is connected to the exhaust pipe 60. The exhaust apparatus 65 decompresses the processing space within the processing container 10 to a predetermined vacuum degree with a vacuum pump (not illustrated).

In the exhaust flow path 62, a conductor 201 and a conductor 202 are provided on the side wall 102 of the processing container 10 and the side surface of the mounting table 20, respectively. The conductor 201 and the conductor 202 are arranged annularly to be orthogonal to the exhaust flow path 62. The conductor 201 and the conductor 202 are formed of a conductor such as, for example, silicon. In addition, the conductors 201 and 202 may be formed of, for example, polysilicon, SiC, or glassy carbon. The installation aspect of the conductor 201 and the conductor 202 will be described below.

On the side wall of the processing container 10, a gate valve G is provided. The gate valve G opens/closes a carry-in/out port when a wafer W is carried into or carried out from the processing container 10.

A plasma processing is performed on a wafer W by the plasma processing apparatus 1 configured as described above. For example, in the case where an etching processing is performed, the opening/closing of the gate valve G is controlled first, and the wafer W is carried into the processing container 10 and mounted on the mounting table 20 by electrostatic attraction. Subsequently, an etching gas is introduced, and the first high frequency power and the second high frequency power are supplied to the upper electrode 25 and the lower electrode 104, respectively, so that plasma is generated. A desired processing such as, for example, the plasma etching, is performed on the wafer W by the generated plasma. After the processing, the opening/closing of the gate valve G is controlled, and the wafer W is carried out from the processing container 10.

Figure 2A:
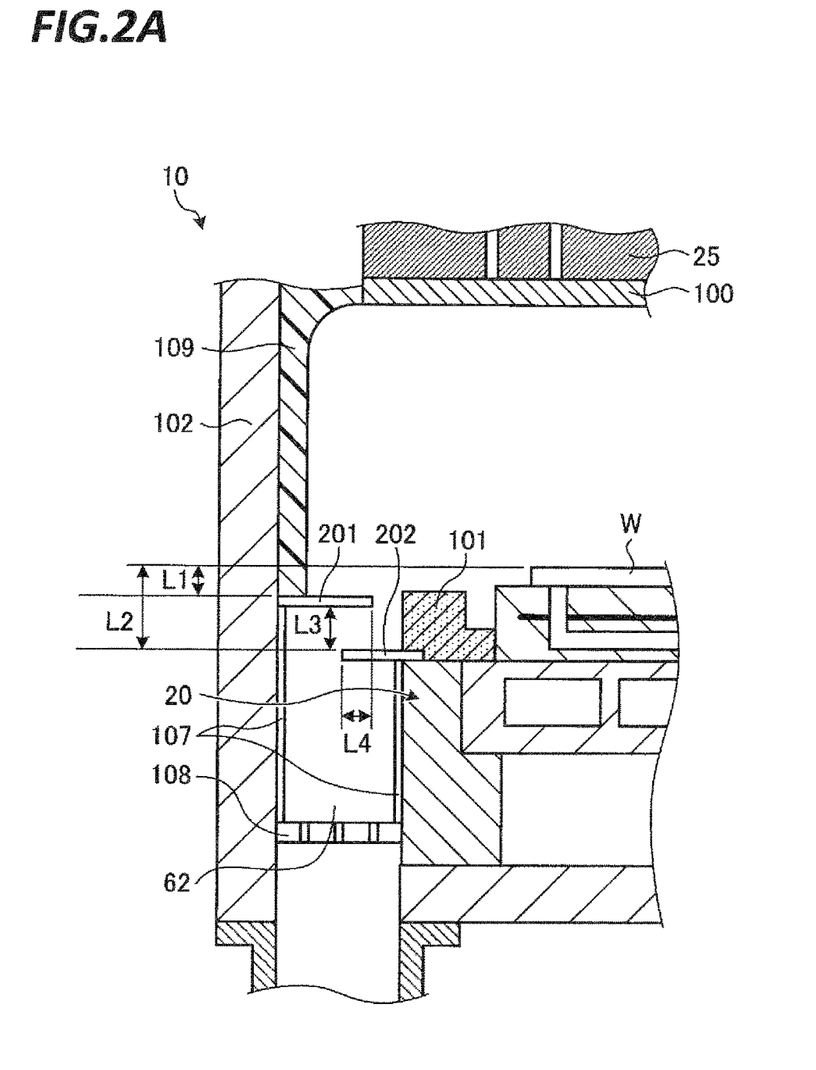
FIG. 2A is a view illustrating an exemplary installation aspect of conductors.

Next, descriptions will be made on the installation aspect of the conductor 201 and the conductor 202 illustrated in FIG. 1. FIG. 2A is a view illustrating an exemplary installation aspect of the conductors. As illustrated in FIG. 2A, the conductor 201 and the conductor 202 are arranged in the exhaust flow path 62 at a position that is higher than the baffle plate 108 and lower than the wafer W mounted on the mounting table 20 to face at least a part of the upper electrode 25. In addition, the conductor 201 and the conductor 202 may be arranged to overlap with each other in the central area of the exhaust flow path 62. More specifically, the conductor 201 is provided on the side wall 102 of the processing container 10, and arranged at a position that is higher than the baffle plate 108 and lower than the wafer W mounted on the mounting table 20 to face at least a part of the upper electrode 25. The distance L1 between the conductor 201 and the to-be-processed surface of the wafer W along the height direction in relation to the to-be-processed surface of the wafer W may be, for example, 1 mm to 70 mm. The distance L1 is set to be within a range where the conductor 201 is made to function as a ground electrode for the upper electrode 25. In addition, the conductor 202 is provided on the side surface of the mounting table 20, and arranged at a position that is higher than the baffle plate 108 and lower than the wafer W mounted on the mounting table 20 to face at least a part of the upper electrode 25. The distance L2 between the conductor 202 and the to-be-processed surface of the wafer W along the height direction in relation to the to-be-processed surface of the wafer W may be 15 mm to 85 mm. The distance L2 is set to be within a range where the conductor 202 is made to function as a ground electrode for the upper electrode 25. In addition, the distance L3 between the conductor 201 and the conductor 202 along the height direction in relation to the to-be-processed surface of the wafer W may be 20 mm to 40 mm.

In addition, the conductor 201 and the conductor 202 may be arranged to partially overlap with each other when viewed in the height direction in relation to the to-be-processed surface of the wafer W. By this, it is possible to avoid the infiltration of the particles existing in the exhaust flow path 62 into the plasma processing space A of the processing container 10. In the case where the conductor 201 and the conductor 202 are arranged to partially overlap with each other, the ratio of the width L4 of the overlapping portion between the conductor 201 and the conductor 202 in relation to the conductor 201 or the conductor 202 may be set to 1.5% to 22.5%, preferably 1.5% to 15%. When the conductor 201 and the conductor 202 are arranged in the exhaust flow path 62 within the above-mentioned ranges, respectively, the exhaust within the processing container 10 can be uniformly and efficiently performed. In addition, because the plasma region generated within the processing container 10 is uniformly widened while increasing an anode/cathode (A/C) ratio, the processing on the wafer W can be uniformly performed.

In addition, while the foregoing description has illustrated an example in which the conductor 201 and the conductor 202 are arranged to partially overlap with each other when viewed in the height direction in relation to the to-be-processed surface of the wafer W, the conductor 201 and the conductor 202 may be arranged not to partially overlap with each other.

Here, the function of the conductor 201 and the conductor 202 as a ground electrode will be described.

Figure 3:
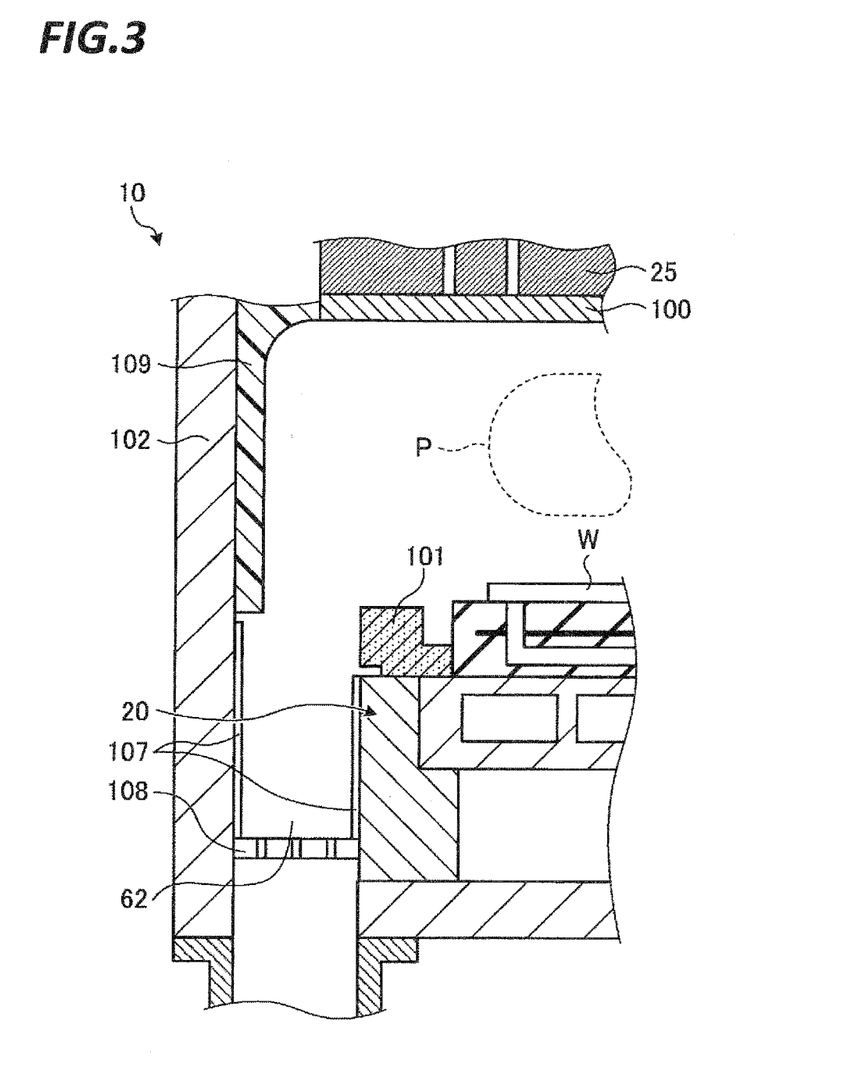
FIG. 3 is a view illustrating a state in which plasma is generated in a plasma processing apparatus of a comparative example.

First, as a comparative example, descriptions will be made on a plasma processing apparatus that does not include a conductor in the exhaust flow path 62. FIG. 3 is a view illustrating a state in which plasma is generated in the plasma processing apparatus of the comparative example. The plasma processing apparatus of the comparative example is different from the plasma processing apparatus 1 of the present exemplary embodiment in that it does not include a conductor in the exhaust flow path 62, and the other features are the same as those of the plasma processing apparatus 1 of the present exemplary embodiment. Thus, in FIG. 3 to be described below, the same components as those of the present exemplary embodiment will be denoted by the same reference numerals.

The plasma processing apparatus of the comparative example does not include a conductor in the exhaust flow path 62. In other words, in the exhaust flow path 62, the upper electrode 25 and a counter electrode are positioned far away from each other (while the baffle plate is apparently illustrated as a counter electrode, a function as the counter electrode is not acting). For this reason, as illustrated in FIG. 3, in the case where plasma P is generated within the processing container 10, the generated plasma P wraps around in the direction of the conductive baffle plate 108 provided in the exhaust flow path 62, and is concentrated to a position above the central portion of the wafer W mounted on the mounting table 20. As a result, the difference between the etching rate corresponding to the central portion of the wafer W and the etching rate corresponding to the peripheral edge of the wafer W may increase, which may deteriorate the uniformity of the etching rate of the wafer W.

Figure 4:
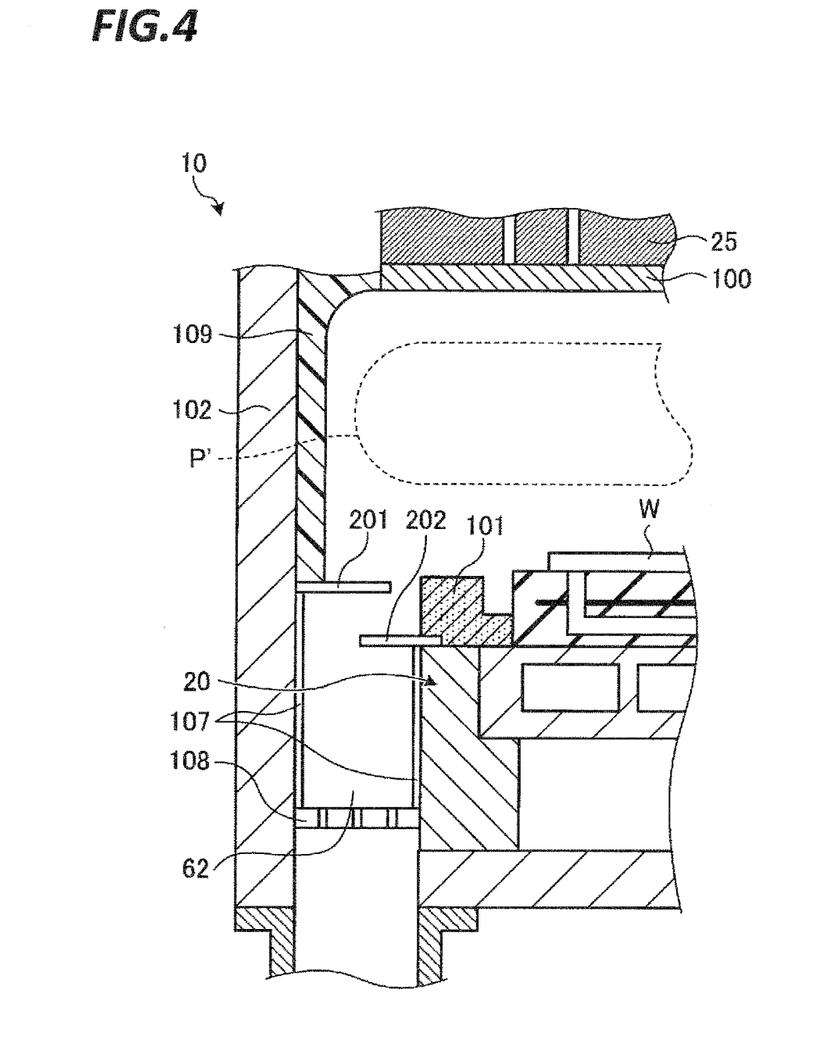
FIG. 4 is a view illustrating a state in which plasma is generated in the plasma processing apparatus of the present exemplary embodiment.

With respect to this, descriptions will be made on the plasma processing apparatus 1 of the present exemplary embodiment. FIG. 4 is a view illustrating a state in which plasma is generated in the plasma processing apparatus of the present exemplary embodiment. In the plasma processing apparatus 1 of the present exemplary embodiment, the conductor 201 and the conductor 202 are arranged in the exhaust flow path 62 at a position that is higher than the baffle plate 108 and lower than the wafer W mounted on the wafer W to face at least a part of the upper electrode 25. For example, etching was performed by setting the distances L1, L2, L3, and L4 to 30 mm, 66 mm, 30.5 mm, and 6.5 mm, respectively, so that the conductor 201 and the conductor 202 were set within the range that allows the conductor 201 and the conductor 202 to function as a ground electrode for the upper electrode 25.

As illustrated in FIG. 4, in the case where plasma P' is generated within the processing container 10, the generated plasma P' expands to the upper side of the central portion of the wafer W and the upper side of the conductor 201 and the conductor 202 without warping around in the direction of the conductive baffle plate 108 provided in the exhaust flow path 62. As a result, the different between the etching rate corresponding to the central portion of the wafer W and the etching rate for the peripheral edge of the wafer W is suppressed so that the in-plane uniformity of the wafer W is improved.

Figure 2B:
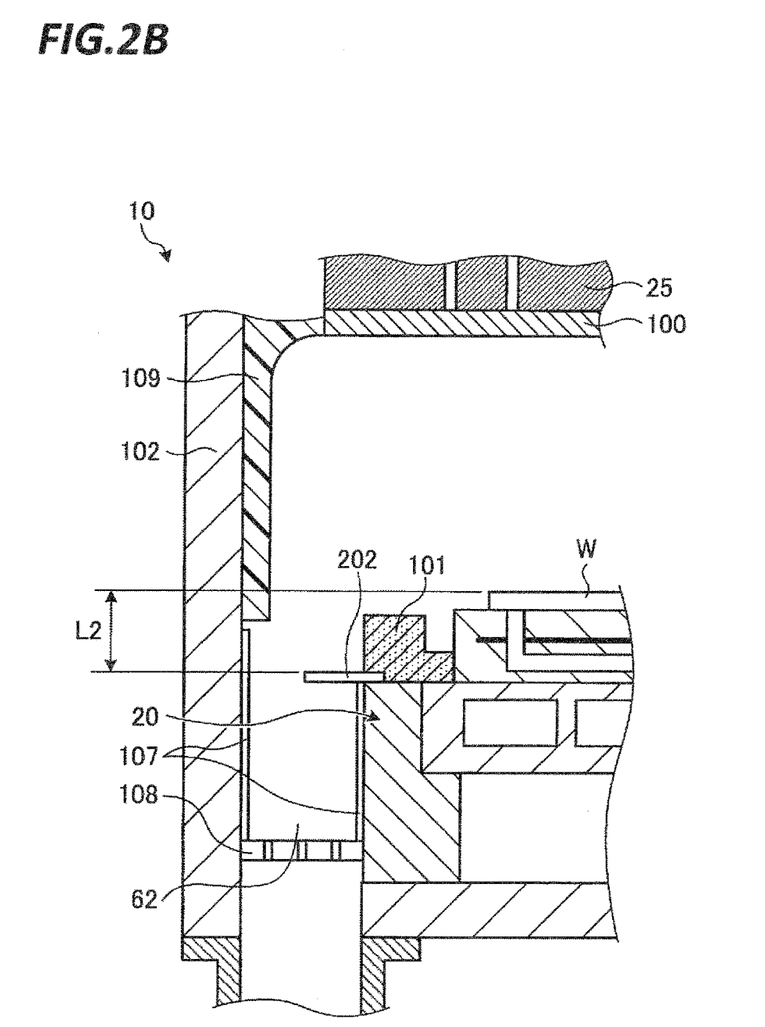
FIG. 2B is a view illustrating a state in which a conductor is only provided on a side surface of a mounting table.

In addition, while FIG. 2A illustrates an example in which the conductor 201 is provided on the side wall 102 of the processing container 10, and the conductor 202 is provided on the side surface of the mounting table 20, the technique disclosed herein is not limited thereto. For example, only the conductor 201 may be provided on the side wall 102 of the processing container 10, or only the conductor 202 may be provided on the side surface of the mounting table 20. For example, a conductor may be provided in an annular shape in the exhaust flow path 62 on at least one of the side wall 102 of the processing container 10 and the side surface of the mounting table 20 such that the conductor is orthogonal to the cross-section of the exhaust flow path 62. FIG. 2B illustrates, as an example, a state in which the conductor 201 is omitted and only the conductor 202 is provided on the side surface of the mounting table 20.

In addition, in terms of increasing an anode/cathode (A/C) ratio, the conductors may be provided on both the side wall 102 of the processing container 10 and the side surface of the mounting table 20 in the exhaust flow path 62, respectively. The A/C ratio increases as the area of the anode side increases in relation to the area of the cathode side. When the conductors are provided on both the side wall 102 of the processing container 10 and the side surface of the mounting table 20, respectively, in the exhaust flow path 62, the apparent area of the anode side increases so that the A/C ratio increases. On the contrary, a sputtering force to the side wall 102 of the processing container 10—the anode— decreases, and as a result, the consumption of a member is suppressed.

Figure 5:
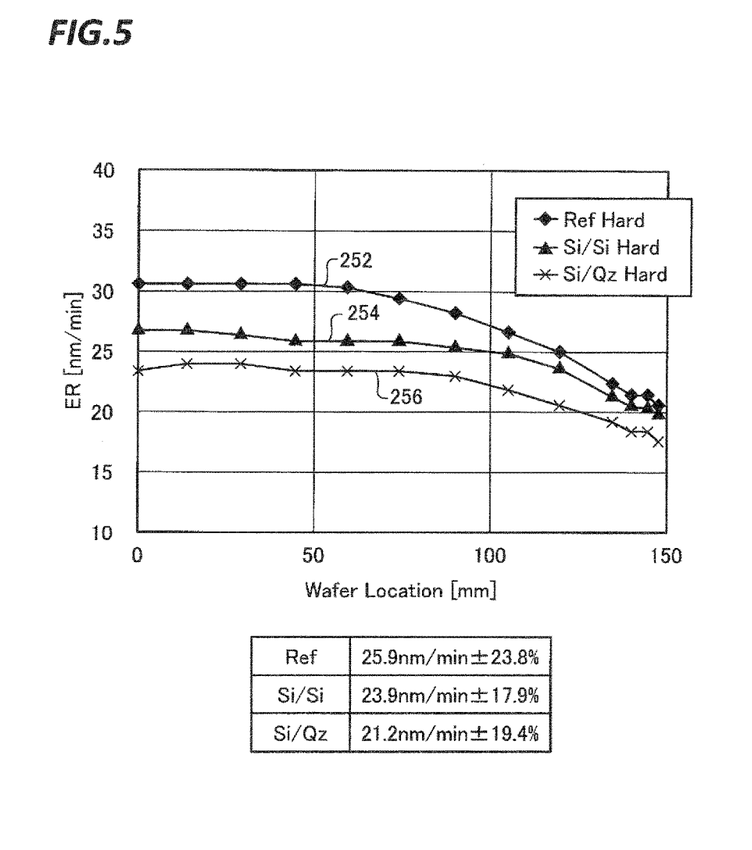
FIG. 5 is a view illustrating etching rates in a case where organic films of wafers were etched by a predetermined processing gas.

Next, descriptions will be made on an effect (etching rate) obtained by the plasma processing apparatus of the present exemplary embodiment. FIG. 5 is a view representing etching rates when organic films of wafers were etched by using a predetermined processing gas.

In FIG. 5, the horizontal axis represents a diametric location [mm] on a wafer W with reference to the position of the center of the wafer W, and the vertical axis represents an etching rate [nm/min] in the case where an organic film on the wafer W was etched by a predetermined processing gas.

In addition, in FIG. 5, Graph 252 is a graph representing an etching rate in the case where an organic film of a wafer W was etched by using a plasma processing apparatus of the comparative example which did not include a conductor in the exhaust flow path 62. Graph 254 is a graph illustrating an etching rate in the case where an organic film of a wafer W was etched by using the plasma processing apparatus 1 of the present exemplary embodiment in which the conductor 201 and the conductor 202 were provided on the side wall 102 of the processing container 10 and the side surface of the mounting table 20 in the exhaust flow path 62, respectively. In addition, in Graph 254, the conductor 201 and the conductor 202 were arranged such that the distances L1, L2, L3, and L4 were set to 30 mm, 66 mm, 30.5 mm, and 6.5 mm, respectively. Graph 256 is a graph representing an etching rate in the case where an organic of a wafer W was etched by using the plasma processing apparatus 1 of the present exemplary embodiment in which the conductor 202 was provided on the side surface of the mounting table 20 in the exhaust flow path 62 and a dielectric was provided on the side wall 102 of the processing container 10 instead of the conductor 201. In addition, the dielectric provided instead of the conductor 201 is formed by a dielectric such as, for example, quartz. In addition, in Graph 256, the conductor 201 and the dielectric were arranged such that the distances L1, L2, L3, and L4 were set to 30 mm, 66 mm, 30.5 mm, and 6.5 mm, respectively.

As represented by Graph 252 in FIG. 5, in the plasma processing apparatus of the comparative example which did not include a conductor in the exhaust flow path 62, the average etching rate along the diametric direction of the wafer W was 25.9 mm/min, and the deviation from the mean etching rate was ±23.8%. Both the average etching rate and the deviation did not satisfy a predetermined allowable specification.

Whereas, as represented by Graph 254 in FIG. 5, in the plasma processing apparatus 1 of the present exemplary embodiment in which the conductor 201 and the conductor 202 were provided on the side wall 102 of the processing container 10 and the side surface of the mounting table 20 in the exhaust flow path 62, respectively, the average etching rate along the diametric direction of the wafer W was 23.9 nm/min, and the deviation from the average etching rate was ±17.9%. Both the average etching rate and the deviation satisfied a predetermined allowable specification. In addition, as represented by Graph 256 in FIG. 5, in the plasma processing apparatus 1 of the present exemplary embodiment in which the conductor 202 was provided on the side surface of the mounting table 20 in the exhaust flow path 62 and the dielectric plate was provided on the side wall 102 of the processing container 10 instead of the conductor 201, the average etching rate along the diametric direction of the wafer W was 21.2 nm/min, and the deviation from the average etching rate was ±19.4%. Both the average etching rate and the deviation satisfied a predetermined allowable specification. That is, in the case where a conductor was provided on at least one of the side wall 102 of the processing container 10 and the side surface of the mounting table 20 in the exhaust flow path 62, the uniformity of the etching rate of the wafer W was improved as compared to the case where no conductor was provided in the exhaust flow path 62. This is thought to have been resulted from the fact that in the case where the conductor is provided on at least one of the side wall 102 of the processing container 10 and the side surface of the mounting table 20 in the exhaust flow path 62, the plasma is spread to the upper side of the central portion of the wafer W and to the upper side of the conductor 201 and the conductor 202 by the function of the conductor as a ground electrode.

Figure 6:
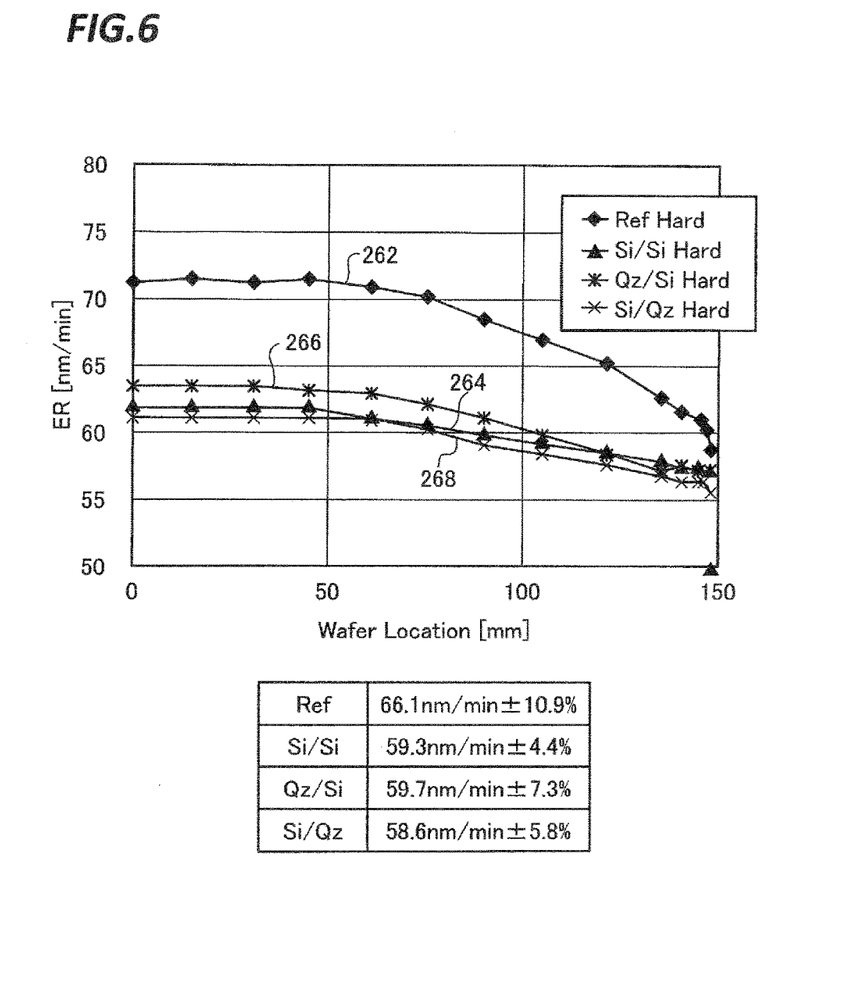
FIG. 6 is a view illustrating an etching rate in a case where oxide films of wafers were etched by a predetermined processing gas.

FIG. 6 is a view illustrating an etching rate in a case where an oxide film of a wafer was etched by a predetermined processing gas. In FIG. 6, the horizontal axis represents a diametric position [mm] of a wafer W with reference to the central position thereof, and the vertical axis represents an etching rate [nm/min] in a case where an oxide film of a wafer W was etched by a predetermined processing gas.

In addition, in FIG. 6, Graph 262 is a graph that represents an etching rate in the case where an oxide film of a wafer W was etched by using a plasma processing apparatus of a comparative example in which no conductor was provided in the exhaust flow path 62. Graph 264 is a graph that represents an etching rate in the case where an oxide film of a wafer W was etched by using the plasma processing apparatus 1 of the present exemplary embodiment in which the conductor 201 and the conductor 202 were provided on the side wall 102 of the processing container 10 and the side surface of the mounting table 20 in the exhaust flow path 62, respectively. In addition, in Graph 264, the conductor 201 and the conductors 202 were arranged such that the distances L1, L2, L3, and L4 were set to 30 mm, 66 mm, 30.5 mm, and 6.5 mm, respectively. Graph 266 is a graph that represents an etching rate in the case where an oxide film of a wafer W was etched by using a plasma processing apparatus 1 of the present exemplary embodiment in which the conductor 201 was provided on the side wall 102 of the processing container 10, and the dielectric was provided on the side surface of the mounting table 20, instead of the conductor 202. In addition, the dielectric that replaced the conductor 202 was formed of a dielectric material such as, for example, quartz. In addition, in Graph 266, the conductor 201 and the dielectric were arranged such that the distances L1, L2, L3, and L4 were set to 30 mm, 66 mm, 30.5 mm, and 6.5 mm, respectively. Graph 268 is a graph that represents an etching rate in the case where an oxide film of a wafer W was etched by using the plasma processing apparatus 1 of the present exemplary embodiment in which the conductor 202 was provided on the side surface of the mounting table 20 in the exhaust flow path 62, and in addition, the dielectric was provided on the side wall 102 of the processing container 10 instead of the conductor 201. In addition, the dielectric that replaces the conductor 201 is formed of a dielectric material such as, for example, quartz. In addition, in Graph 268, the dielectric and the conductor 202 were arranged such that the distances L1, L2, L3, and L4 were set to 30 mm, 66 mm, 30.5 mm, and 6.5 mm, respectively.

As represented by Graph 262 of FIG. 6, in the plasma processing apparatus of a comparative example that did not include a conductor in the exhaust flow path 62, the average etching rate along the diametric direction of the wafer W was 66.1 mm/min, and the deviation from the average etching rate was ±10.9%. Both the average etching rate and the deviation did not satisfy the predetermined allowable specifications.

On the contrary, as represented by Graph 264 in FIG. 6, in the plasma processing apparatus 1 of the present exemplary embodiment in which the conductor 201 and the conductor 202 were provided on the side wall 102 of the processing container 10 and the side surface of the mounting table 20 in the exhaust flow path 62, respectively, the average etching rate according to the diametric direction of the wafer W was 59.3 nm/min, and the deviation from the average etching rate was ±4.4%. Both the average etching rate and the deviation satisfied the predetermined allowable specifications. In addition, as represented by Graph 266 in FIG. 6, in the plasma processing apparatus 1 of the present exemplary embodiment in which the conductor 201 was provided on the side wall 102 of the processing container 10, and a dielectric plate was provided on the side surface of the mounting table 20 instead of the conductor 202, the average etching rate according to the diametric direction of the wafer W was 59.7 nm/min and the deviation from the average etching rate was ±7.3%. Both the average etching rate and the deviation satisfied the predetermined allowable specification. In addition, as represented by Graph 268 in FIG. 6, in the plasma processing apparatus 1 of the present exemplary embodiment in which the conductor 202 was provided on the side surface of the mounting table 20 in the exhaust flow path 62 and the dielectric plate was provided on the side wall 102 of the processing container 10, instead of the conductor 201, the average etching rate along the diametric direction of the wafer W was 58.6 nm/min and the deviation from the average etching rate was ±5.8%. Both the average etching rate and the deviation satisfied the predetermined allowable specifications. That is, in the case where a conductor was provided on at least one of the side wall 102 of the processing container 10 and the side surface of the mounting table 20 in the exhaust flow path 62, the uniformity of the etching rate of the wafer W was improved as compared to a case in which no conductor is provided in the exhaust flow path 62. It is believed that this is resulted from the fact that in the case where the conductor is provided on at least one of the side wall 102 of the processing container 10 and the side surface of the mounting table 20 in the exhaust flow path 62, plasma is spread to the upper side of the central portion of the wafer W and to the upper side of the conductor 201, 202 due to the function of the conductor as a ground electrode.

As described above, in the plasma processing apparatus 1 of the present exemplary embodiment, the conductor 201 and the conductor 202 were arranged in the exhaust flow path 62 to face at least a part of the upper electrode 25, and the distance of the conductors in the height direction in relation to the to-be-processed surface of the wafer W was set to be within a predetermined range. By this, when plasma P' is generated within the processing container 10, the generated plasma P' is spread to the upper side of the central portion of the wafer W and to the upper side of the conductor 201 and the conductor 202 without warping around in the direction of the conductive baffle plate 108 provided in the exhaust flow path 62. As a result, a difference between the etching rate that corresponds to the central portion of the wafer W and the etching rate that corresponds to the peripheral edge of the wafer W is suppressed such that the uniformity of the etching rate of the wafer W can be improved.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
a processing container;
a gas supply unit configured to supply a processing gas into the processing container;
an electrostatic chuck located within the processing container, and configured to mount a to-be-processed substrate thereon;
a mounting table located below the electrostatic chuck and is configured to support the electrostatic chuck;
an upper electrode located at an upper side of the electrostatic chuck;
a plasma generation unit configured to supply a high frequency power to at least one of the upper electrode and the mounting table to generate plasma of the processing gas within the processing container;
an exhaust flow path formed by a side wall of the processing container and a side surface of the mounting table;
an electrically conductive rectification plate located in the exhaust flow path, and configured to adjust a flow of the processing gas that is discharged to outside of the processing container by the exhaust flow path; and
a first electrical conductor and a second electrical conductor arranged in the exhaust flow path at a position higher than the rectification plate and lower than the to-be-processed substrate to face at least a part of the upper electrode, a distance of the first electrical conductor and the second electrical conductor in a height direction in relation to a to-be-processed surface of the to-be-processed substrate being set to be within a predetermined range,
wherein the first electrical conductor is located on the side surface of the mounting table and separate from the side wall of the processing container,
wherein the second electrical conductor is located on the side wall of the processing container and separate from the side surface of the mounting table, and
wherein the first electrical conductor and the second electrical conductor are arranged to overlap with each other in a central area of the exhaust flow path.

2. The plasma processing apparatus of claim 1, wherein the first electrical conductor is located at a position lower than the first electrical conductor.

3. The plasma processing apparatus of claim 1, wherein a distance between the first electrical conductor and the second electrical conductor along the height direction is within a range of 20 mm to 40 mm.

* * * * *